(12) United States Patent
Aslett et al.

(10) Patent No.: US 10,774,417 B2
(45) Date of Patent: Sep. 15, 2020

(54) MULTISURFACE SIMULTANEOUS SPUTTERING AND SHUTTERING

(71) Applicant: Materion Corporation, Mayfield Heights, OH (US)

(72) Inventors: Zan Aslett, Brookline, NH (US); Michael P. Newell, Groton, MA (US); Donald W. Ahern, Westford, MA (US)

(73) Assignee: MATERION CORPORATION, Mayfield Heights, OH (US)

( * ) Notice: Subject to any disclaimer, the term of this patent is extended or adjusted under 35 U.S.C. 154(b) by 437 days.

(21) Appl. No.: 15/609,268

(22) Filed: May 31, 2017

(65) Prior Publication Data

US 2017/0350003 A1    Dec. 7, 2017

Related U.S. Application Data

(60) Provisional application No. 62/345,182, filed on Jun. 3, 2016.

(51) Int. Cl.

| C23C 14/34 | (2006.01) |
|---|---|
| C23C 14/54 | (2006.01) |
| H01J 37/32 | (2006.01) |
| C23C 14/50 | (2006.01) |
| H01J 37/34 | (2006.01) |

(52) U.S. Cl.
CPC .......... *C23C 14/54* (2013.01); *C23C 14/3464* (2013.01); *C23C 14/505* (2013.01); *H01J 37/32403* (2013.01); *H01J 37/32651* (2013.01); *H01J 37/3417* (2013.01); *H01J 37/3447* (2013.01)

(58) Field of Classification Search
CPC .................... H01J 37/32651; H01J 37/3447
See application file for complete search history.

(56) References Cited

U.S. PATENT DOCUMENTS

| 2009/0236218 A1* | 9/2009 | Teer ................. C23C 14/352 |
|---|---|---|
| | | 204/192.12 |
| 2014/0087092 A1* | 3/2014 | Nieh ................ H01J 37/32422 |
| | | 427/569 |

* cited by examiner

*Primary Examiner* — Jason Berman
(74) *Attorney, Agent, or Firm* — Tucker Ellis LLP

(57) ABSTRACT

A deposition system comprises a vacuum chamber having a cylindrical inner wall, a cylindrical parts carousel disposed concentrically inside the cylindrical inner wall of the vacuum chamber, and one or more deposition sources arranged to flow deposition material onto the cylindrical parts carousel. A cylindrical shutter assembly is disposed concentrically inside the cylindrical inner wall of the vacuum chamber, and has (1) a shuttered position in which the cylindrical shutter assembly blocks the one or more deposition sources from depositing onto the parts carousel and (2) an unshuttered position in which the cylindrical shutter assembly does not block the one or more deposition sources from depositing onto the parts carousel. A drive train rotates the cylindrical shutter assembly between the shuttered and unshuttered positions. The drive train not operatively connected to rotate the cylindrical parts carousel. The deposition sources may include inner and outer sputter sources.

19 Claims, 10 Drawing Sheets

MULTISURFACE SIMULTANEOUS SPUTTERING AND SHUTTERING

This application claims the benefit of U.S. Provisional Patent Application Ser. No. 62/345,182, filed Jun. 3, 2016 and titled "MULTISURFACE SIMULTANEOUS SPUTTERING AND SHUTTERING". U.S. Provisional Patent Application Ser. No. 62/345,182, filed Jun. 3, 2016 and titled "MULTISURFACE SIMULTANEOUS SPUTTERING AND SHUTTERING" is hereby incorporated by reference in its entirety into the specification of this application.

BACKGROUND

The following relates to the coating arts, layer or coating deposition arts, sputtering deposition arts, and the like.

BRIEF DESCRIPTION

In some illustrative aspects disclosed herein, a deposition system comprises: a vacuum chamber; a cylindrical parts carousel sized to load inside the vacuum chamber and having a carousel drive train operatively connected to rotate the cylindrical parts carousel about a cylinder axis; one or more deposition sources arranged to flow deposition material onto the cylindrical parts carousel when the cylindrical parts carousel is loaded inside the vacuum chamber; a shutter assembly including at least one cylindrical shutter sub-assembly having shutter elements, the shutter assembly disposed or sized to load inside the vacuum chamber with the at least one cylindrical shutter sub-assembly arranged concentrically with the cylindrical parts carousel; and a drive train configured to rotate the shutter assembly about the cylinder axis independently of rotation of the cylindrical parts carousel about the cylinder axis. The drive train is configured to rotate the at least one cylindrical shutter sub-assembly between (1) a shuttered position in which the shutter elements are interposed between the one or more deposition sources and the parts carousel and (2) an unshuttered position in which the shutter elements are not interposed between the one or more deposition sources and the parts carousel.

In some illustrative aspects disclosed herein, a shuttering system is disclosed for shuttering sputter deposition sources of a sputter deposition system during pre-burn of the sputter deposition sources. The sputter deposition system has a cylindrical parts carousel that rotates during sputter deposition. The shuttering system comprises at least one cylindrical shutter sub-assembly and a drive train. The at least one cylindrical shutter sub-assembly is sized to be arranged concentrically inside or outside of the cylindrical parts carousel, and has shutter elements arranged to (1) block the sputter deposition sources when the cylindrical shutter sub-assembly is in a shuttered rotational position and (2) not block the sputter deposition sources when the cylindrical shutter sub-assembly is in an unshuttered rotational position. The drive train is configured to rotate the at least one cylindrical shutter sub-assembly between the shuttered and unshuttered rotational positions. The drive train is configured to rotate the at least one cylindrical shutter sub-assembly independently from the rotation of the cylindrical parts carousel.

In some illustrative aspects disclosed herein, a coating method comprises rotating a cylindrical parts carousel loaded with parts to be coated. While rotating the cylindrical parts carousel loaded with parts to be coated, material is deposited onto the rotating cylindrical parts carousel loaded with parts to be coated by operating one or more deposition sources. Prior to the depositing, pre-burn of the one or more deposition sources is performed with a cylindrical shutter in a shuttered rotational position in which shutter elements of the cylindrical shutter block the one or more deposition sources from depositing material onto the rotating cylindrical parts carousel loaded with parts to be coated. After performing the pre-burn but before performing the depositing, the cylindrical shutter is rotated from the shuttered rotational position to an unshuttered rotational position in which the shutter elements of the cylindrical shutter do not block the one or more deposition sources from depositing material onto the rotating cylindrical parts carousel loaded with parts to be coated. The rotating of the cylindrical shutter from the shuttered rotational position to the unshuttered rotational position is performed using a drive train that is operatively coupled to rotate the cylindrical shutter and that is not operatively coupled to rotate the cylindrical parts carousel loaded with parts to be coated.

In some illustrative aspects disclosed herein, a deposition system comprises: a vacuum chamber having a cylindrical inner wall; a cylindrical parts carousel disposed concentrically inside the cylindrical inner wall of the vacuum chamber; one or more deposition sources arranged to flow deposition material onto the cylindrical parts carousel; a cylindrical shutter assembly disposed concentrically inside the cylindrical inner wall of the vacuum chamber and having (1) a shuttered position in which the cylindrical shutter assembly blocks the one or more deposition sources from depositing onto the parts carousel and (2) an unshuttered position in which the cylindrical shutter assembly does not block the one or more deposition sources from depositing onto the parts carousel; and a drive train configured to rotate the cylindrical shutter assembly between the shuttered and unshuttered positions, the drive train not operatively connected to rotate the cylindrical parts carousel.

DETAILED DESCRIPTION

Figure 1:
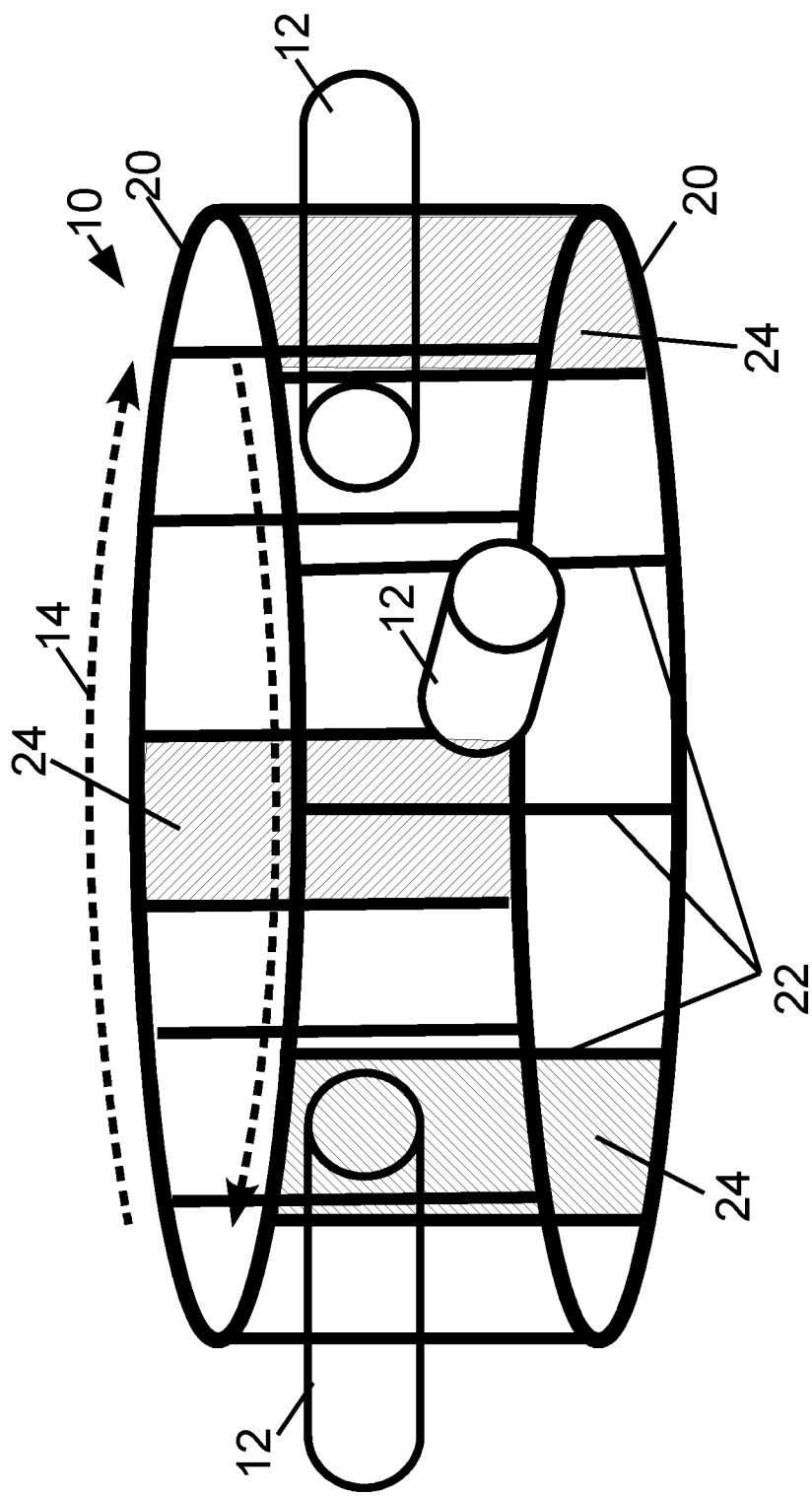
FIG. 1 diagrammatically illustrates a perspective view of a rotating parts carousel and three deposition sources in accordance with a first deposition system embodiment, during deposition employing the deposition sources.

With reference to FIG. 1, a perspective view is shown of a rotating parts carousel 10 and three deposition sources 12 in accordance with a first deposition system embodiment. FIG. 1 diagrammatically depicts these components during deposition employing the deposition sources 12. Not shown in FIG. 1 are additional components such as a motor and drive train for rotating the carousel 10 about its cylinder axis, and a surrounding vacuum chamber that is preferably generally cylindrical in shape and arranged coaxially around the carousel 10. The deposition sources 12 can be any type of source suitable for generating a flux of deposition atoms, molecules, or particles. In a preferred embodiment, the deposition sources 12 are sputter deposition sources, in which a sputtering gas such as argon is flowed into the vacuum chamber and each deposition source 12 includes a sputter source of a chosen material with an electrical bias arrangement (typically a.c.) between the sputter source and parts loaded into the carousel 10 (i.e., the sputter target). The bias arrangement ionizes the sputtering gas and drives the ions into the sputter source to eject (i.e. sputter) atoms, molecules, or particles that deposit onto the parts (i.e. sputter target) loaded into the carousel 10. In this arrangement, the various deposition sources 12 may be energized (i.e. electrically biased) in a chosen sequence to sequentially deposit different materials. For example, in some practical commercial deposition processes, a sequence of a chromium adhesion layer, an intermediate nickel layer, and then a thick silver or gold layer may be deposited. Other metal sequences such as gold and palladium (Au/Pd), and/or non-metallic layers such as zinc oxide, tin oxide, or titanium dioxide may similarly be deposited, for example by sputtering zinc, tin, or titanium respectively while flowing oxygen gas or an oxygen-containing precursor gas into the vacuum chamber. To achieve high uniformity, the carousel is cylindrical and is rotated during deposition about its cylinder axis as indicated in FIG. 1 by rotation-indication arrows 14.

In illustrative FIG. 1 the deposition sources 12 are all located at the outside of the cylindrical carousel 10, i.e. at the outer wall of the carousel 10, or said another way at a larger radius respective to the cylinder axis of the carousel, and arranged to flow deposition material "inward" onto the carousel 10. In other embodiments, the deposition sources are located on the inside of the carousel 10, i.e. at the inner wall of the carousel 10, or said another way at a smaller radius respective to the cylinder axis of the carousel, and arranged to flow deposition material "outward" onto the carousel 10. In yet other embodiments, each deposition source 12 includes a pair of sputter sources, one located outside the carousel 10 and the other inside, which provides a higher deposition rate and greater uniformity if the parts loaded in the carousel 10 are held in fixed positions on the parts carousel 10. While three deposition sources 12 are illustrated, the number of deposition sources may be one, two, three, four, five, six, seven, or more, with the maximum number of sources that can be installed being limited by the size of the sources 12 and how many can fit around the circumference of the cylindrical carousel 10.

The carousel 10 is designed to load a large number of parts, e.g. rods, screws, or other parts to be coated. To provide a largely open topology, the illustrative carousel comprises two parallel spaced-apart rings 20 connected by transverse posts 22. The rings 20 may have some width in the radial direction to provide support surfaces for the loaded parts, and/or the carousel may include clips or other fasteners (not shown) for securing parts to be coated in the carousel 10.

Prior to performing the deposition the deposition sources 12 may need some preparation. For example, in the case of many types of metallic sputter sources, when the vacuum chamber is opened so that the sputter sources are exposed to atmosphere the metal surface of the sputter sources rapidly oxidize. After the parts are loaded into the carousel 10 (which in some embodiments may be removable from the cylindrical vacuum chamber to facilitate the loading) and the vacuum chamber is pumped down, the sputter sources therefore have a layer of oxide on their surfaces. Before performing the sputter deposition coating, therefore, the oxidized layer is preferably removed from the sputter sources as it will normally cause poor performance (e.g. poor adhesion of the sputtered metal, contamination by sputtered oxygen and/or organics) in the sputter deposition run. This oxide removal is accomplished with the vacuum chamber under vacuum by energizing the two sputter sources to burn or sputter the oxide layer away leaving a pristine sputter source surface that is free of oxidation to be used for sputter coating the parts loaded into the carousel 10. This initial oxide removal is known in the art as "pre-burn". It will be appreciated that similar pre-burn may be called for when using deposition sources other than sputter sources, as regardless of the deposition source configuration the source material is likely to develop a contaminating oxide layer during exposure to atmosphere.

Figure 2:
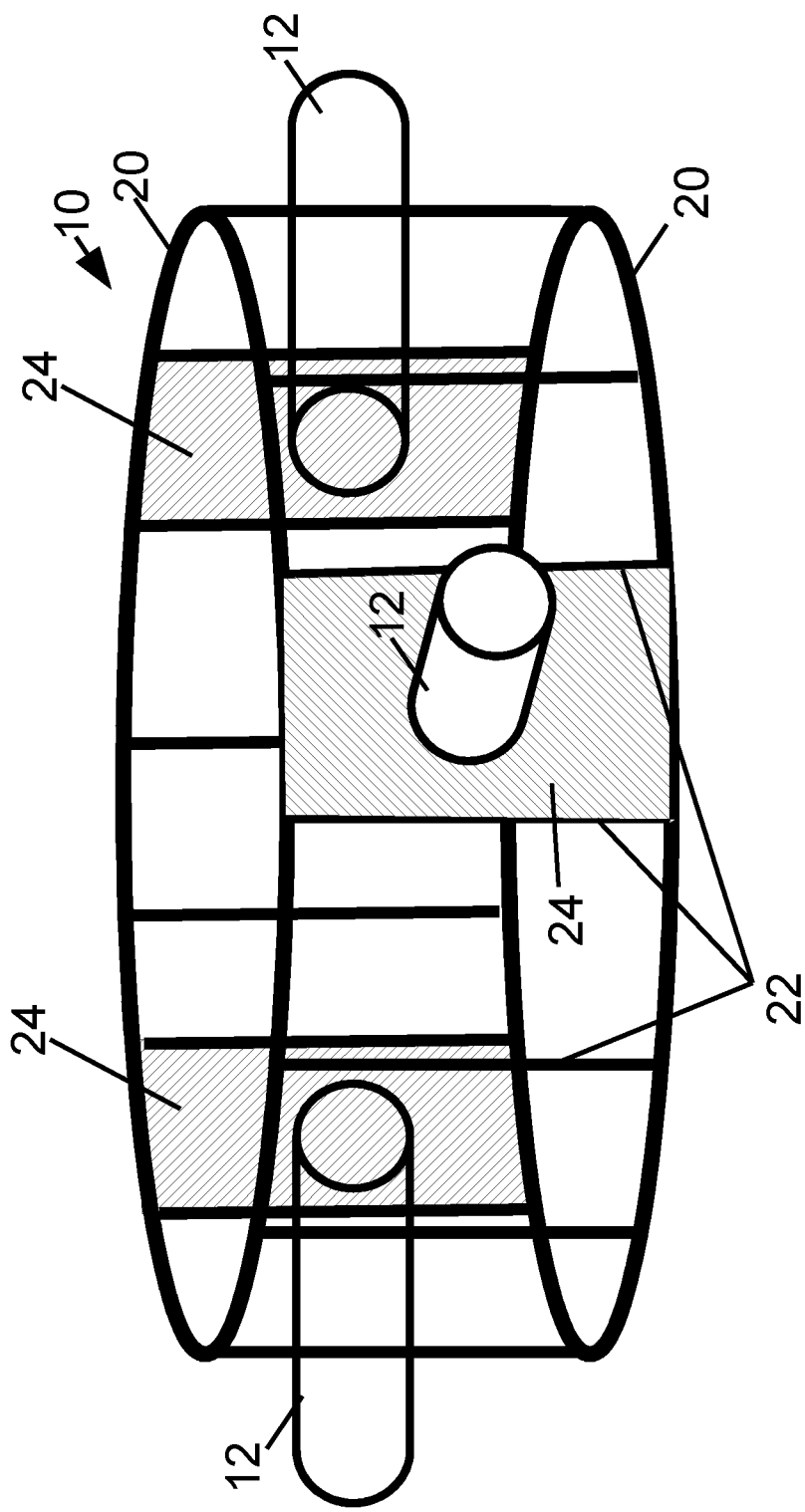
FIG. 2 diagrammatically illustrates a perspective view of the parts carousel and three deposition sources in accordance with the first deposition system embodiment with the carousel positioned for initial pre-burn of the sources.

With continuing reference to FIG. 1 and with further reference to FIG. 2, it is not desirable that the oxidized layer removed during pre-burn be allowed to deposit onto or coat the parts loaded into the carousel 10—indeed, avoiding such contamination is the point of performing the initial pre-burn. To protect the parts (i.e. sputter targets) during pre-burn, blanking plates 24 are installed in sections of the carousel 10. As shown in FIG. 2, during pre-burn the carousel 10 does not rotate, and the non-rotating carousel 10 is oriented with a blanking plate 24 positioned at each deposition source 12. In this way, the oxides, organics, or other contaminants that are sputtered away during pre-burn are deposited onto the blanking plates 24 rather than onto the parts loaded into the carousel 10.

Figure 3:
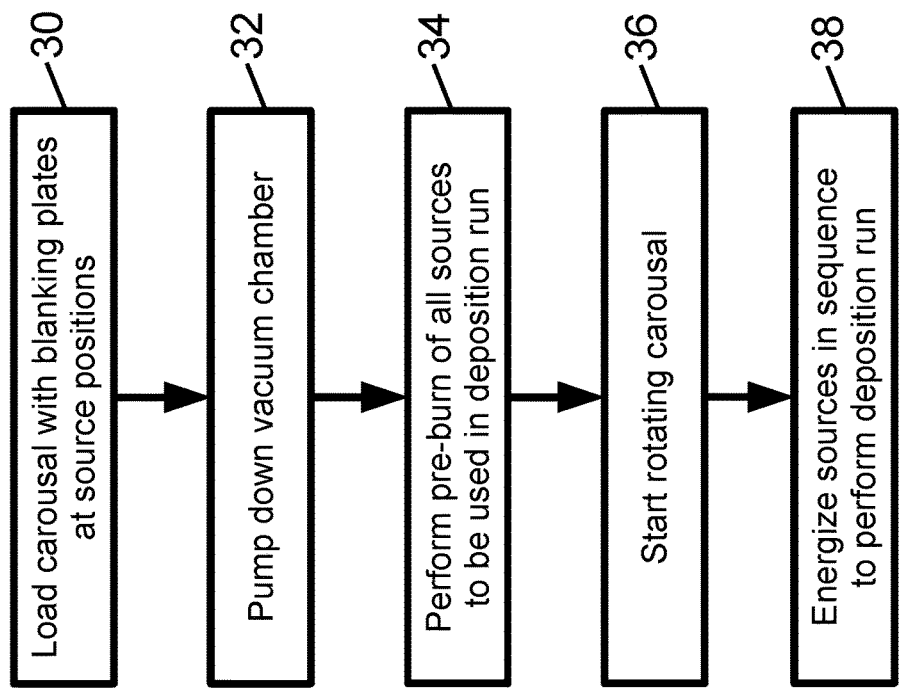
FIG. 3 diagrammatically illustrates a deposition method suitably performed using the first deposition system embodiment.

With continuing reference to FIGS. 1 and 2, and with further reference to FIG. 3, a sputter deposition run performed by the first deposition system embodiment of FIGS. 1 and 2 is described. In an operation 30, the carousel 10 containing parts to be coated is loaded into the vacuum chamber with the blanking plates 24 at the positions of the respective deposition sources 12 to be used. This is the configuration shown in FIG. 2. Note that if the deposition system has a relatively large number of deposition sources 12 (e.g. three, four, five, et cetera) and different deposition runs may use different deposition sources, then the blanking plates 24 are preferably designed to be installed in different receptacles (e.g., different slots) of the carousel 10, and for a particular upcoming sputter deposition run blanking plates 24 are loaded into the receptacles of the carousel 10 that align with the deposition sources to be used in the upcoming run. In an operation 32 the vacuum chamber is pumped down. In an operation 34, the pre-burn is performed on all deposition sources 12 that are to be used in the sputter deposition run. The carousel 10 is not rotated during the pre-burn operation 34, so that the blanking plates 24 remain stationary at the respective deposition sources to receive the contaminants sputtered off the deposition sources during the pre-burn 34. After the pre-burn 34 is complete, the deposition sources are de-energized and the carousel is brought up to rotational speed in an operation 36, as shown in FIG. 1. Thereafter, in an operation 38 the sputter deposition is performed by energizing sputter deposition sources 12 in the desired sequence (for a multi-layer deposition) to deposit the desired layers. It will be noted that during the deposition the blanking plates 24 remain in place on the carousel 10 (since the vacuum cannot be broken to remove them without re-oxidizing the deposition sources 12).

A disadvantage of the first embodiment of FIGS. 1-3 is that the blanking plates 24 occupy valuable space on the carousel 10. These blanking plates 24 cannot be made too narrow in the circumferential direction, since if the blanking plates 24 are too narrow they will not capture all of the contaminants that are sputtered off the sources 12 during the pre-burn operation 34. In some embodiments, the blanking plates 24 occupy up to about 40% of the capacity of the carousel 10. This results in reduced parts throughput since parts cannot be loaded into the portions of the carousel 10 that are occupied by the blanking plates 24, as well as wasted material that is sputtered onto the blanking plates 24 during the deposition operation 38. While these effects may seem small, in practice if 40% of the space of the carousel 10 is occupied by the blanking plates 24 this translates to a 40% reduction in parts throughput and 40% wasted material.

With reference now to FIGS. 4-10, a second deposition system embodiment is described, which overcomes the aforementioned disadvantages of the blanking plates 24 installed in the carousel 10.

Figure 4:
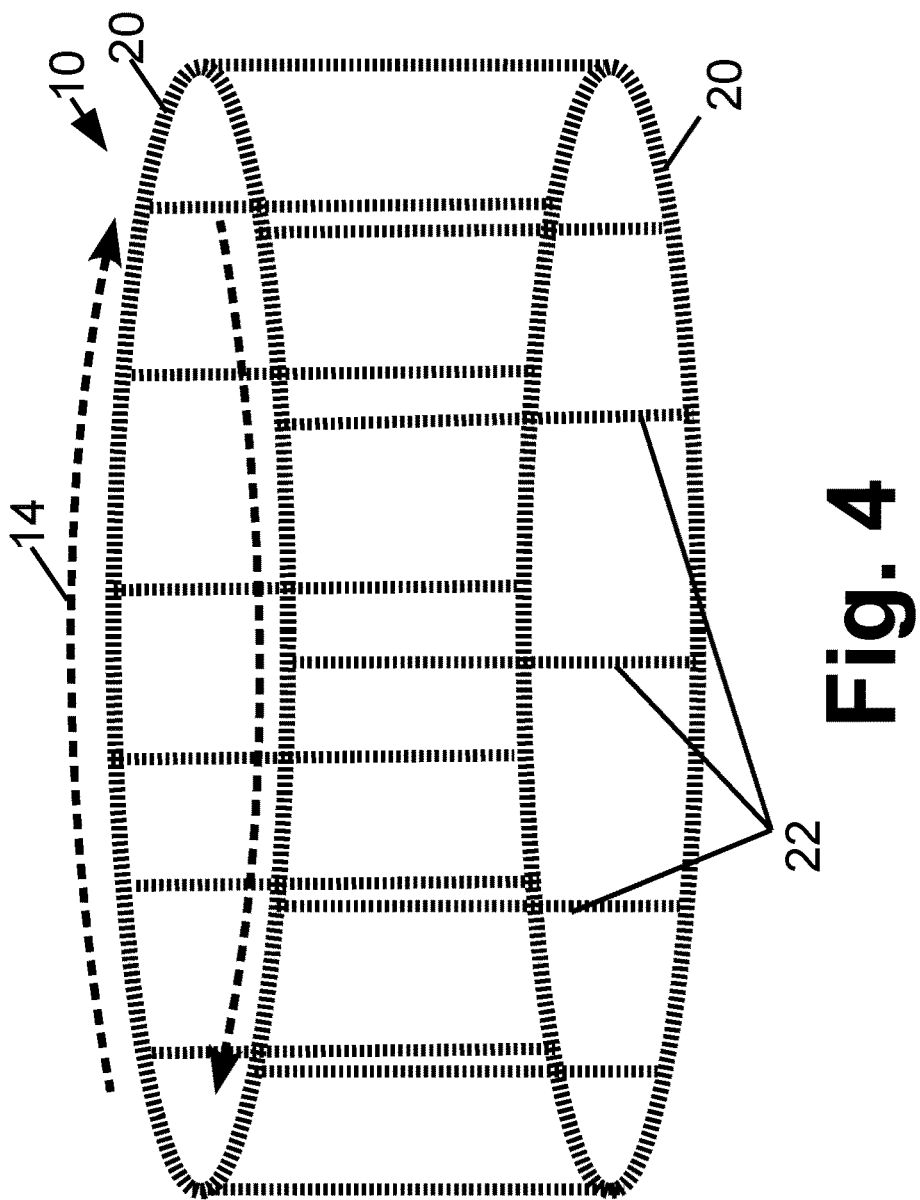
FIG. 4 diagrammatically illustrates a perspective view of a parts carousel in accordance with a second deposition system embodiment.
Figure 5:
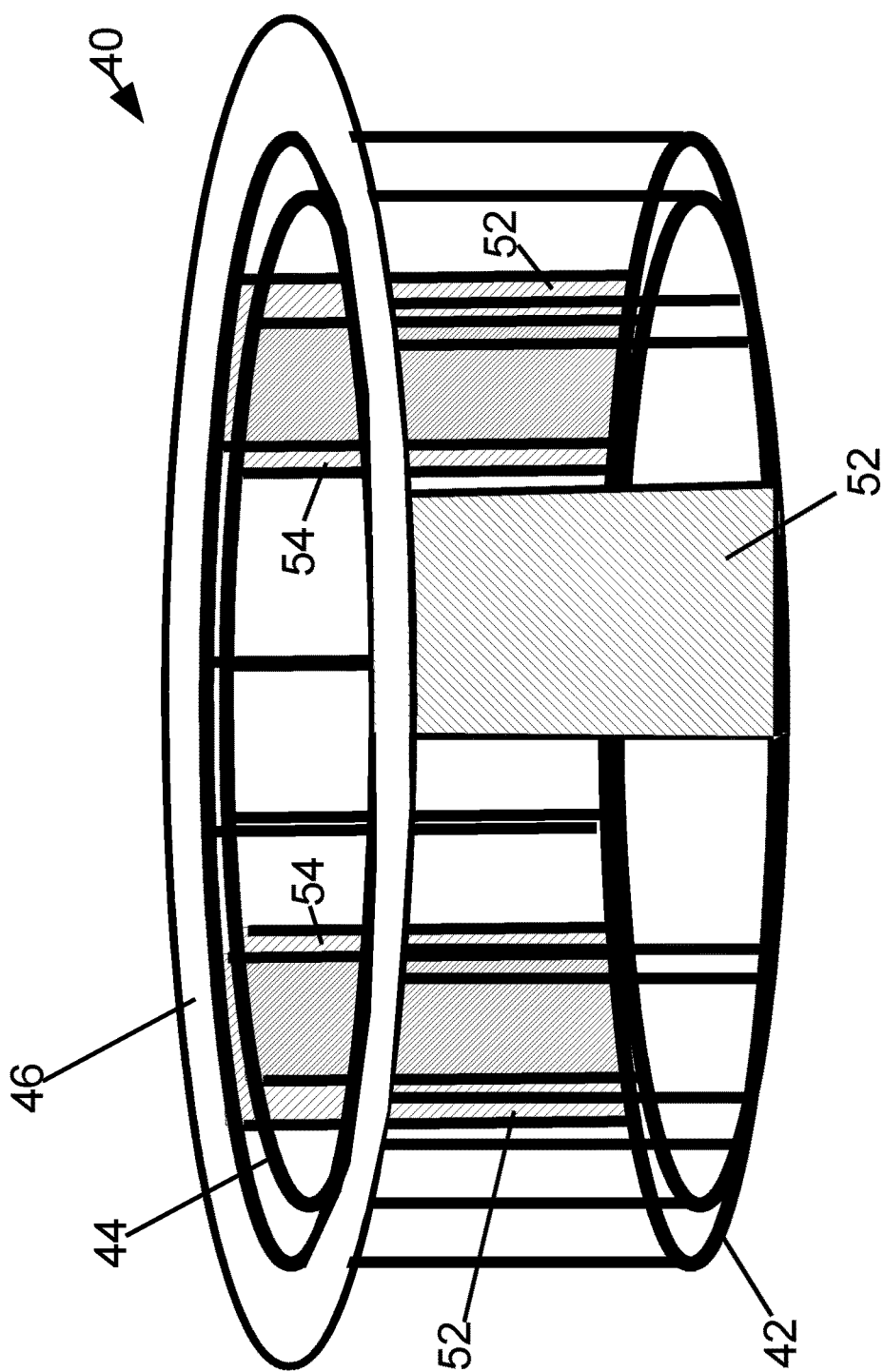
FIG. 5 diagrammatically illustrates a perspective view of a sources shutter in accordance with the second deposition system embodiment.

With reference to FIGS. 4 and 5, the carousel 10 previously described is also used in the second deposition system embodiment, but without loading any of the blanking plates 24 into the carousel 10. This is shown in FIG. 4. Instead, a separate shutter assembly 40 is provided, as shown in FIG. 5. Note that in depicting the second deposition system embodiment of FIGS. 4-10, the carousel 10 is shown using dotted lines while the shutter assembly 40 is depicted using solid lines, to assist in visually distinguishing these two components 10, 40. The shutter assembly 40 is cylindrical, and includes an outer shutter sub-assembly 42 at a larger diameter than the outer diameter of the carousel 10, and an inner shutter sub-assembly 44 at a smaller diameter than the inner diameter of the carousel 10. The outer shutter sub-assembly 42 serves to shutter deposition sources located outside of the carousel 10 that flow sputtered material inward, while the inner shutter sub-assembly 44 serves to shutter deposition sources located inside of the carousel 10 that flow sputtered material outward. (Naturally, if the sputter sources 12 include only sources located outside of the carousel 10 then the inner shutter sub-assembly 44 may be omitted; while if the sputter sources 12 include only sources located inside of the carousel 10 then the outer shutter sub-assembly 42 may be omitted.) The shutter sub-assemblies 42, 44 are connected at one end by a connecting ring or yoke 46 such that the shutter sub-assemblies 42, 44 are yoked together to rotate as a unit. Each shutter sub-assembly 42, 44 has a largely open structure, for example similar to the arrangement of two parallel spaced-apart rings 20 connected by transverse posts 22 used for the carousel 10.

The outer shutter sub-assembly 42 includes outer shutter elements 52 and the inner shutter sub-assembly 44 includes inner shutter elements 54. These shutter elements 52, 54 serve the same purpose as the blanking plates 24 of the first deposition system embodiment of FIGS. 1-3, but are mounted on the shutter assembly 40 rather than on the carousel 10.

Figure 6:
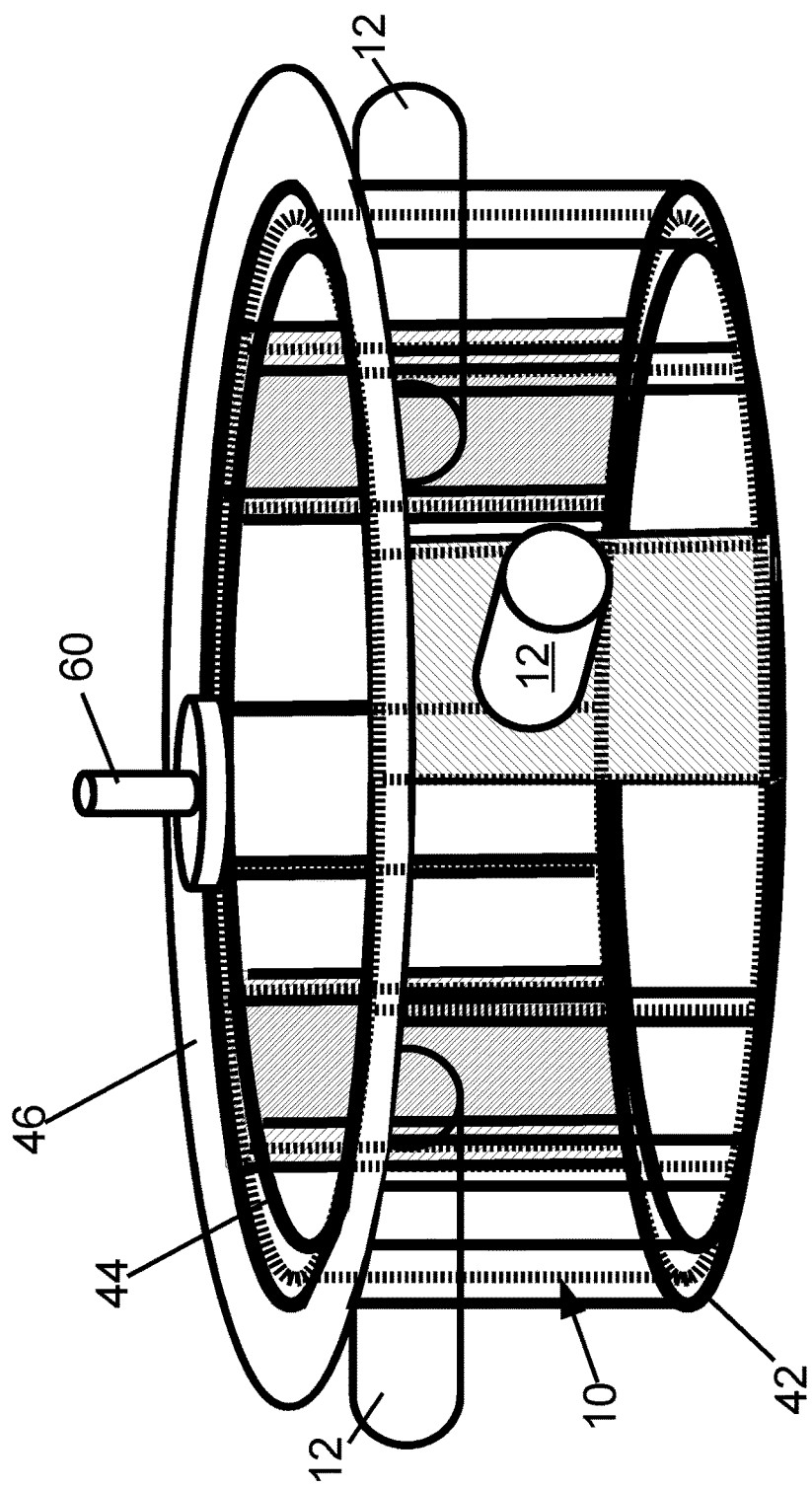
FIG. 6 diagrammatically illustrates a perspective view of the parts carousel of FIG. 4 and the sources shutter of FIG. 5 along with a shutter drive mechanism in accordance with the second deposition system embodiment, with the sources shutter positioned for initial pre-burn of the sources.

With reference to FIG. 6, the shutter assembly 40 is installed coaxially with the carousel 10 (that is, the cylindrical carousel and the cylindrical shutter sub-assemblies 42, 44 share a common cylinder axis), with the outer shutter sub-assembly 42 positioned at a larger radius (respective to the common cylinder axis) than the carousel 10 so that its shutter elements 52 are interposed between the outer deposition sources 12 and the carousel 10, and with the inner shutter sub-assembly 44 positioned at a smaller radius (respective to the common cylinder axis) than the carousel 10 so that its shutter elements 54 are interposed between the inner deposition sources (not shown) and the carousel 10. FIG. 6 illustrates the positioning of the shutter assembly 40 during pre-burn—in this positioning, the shutter elements 52, 54 are positioned at respective deposition sources 12 (again, only the outer deposition sources 12 are shown in FIG. 6) to block sputtered contaminants during the pre-burn.

Furthermore, a suitable shutter drive train 60 is provided which is energized by electrical vacuum feedthroughs or a rotary mechanical vacuum feedthrough (not shown) to electrically or manually rotate the shutter assembly 40 about the (common) cylinder axis independently from the rotation of the carousel 10 about the (common) cylinder axis. After the pre-burn is complete, the deposition sources 12 are de-energized. Thereafter, the drive train 60 is operated without breaking vacuum of the vacuum chamber to rotate the shutter assembly 40 to move the shutter elements 52, 54 away from the respective deposition sources 12 so that they no longer block these sources 12 from sputtering onto the carousel 10. The drive train 60 may be operated by applying electrical power (in an embodiment in which the drive train 60 includes an in situ motor that can be energized via an electrical vacuum feedthrough), or by manually or automatically rotating a rotary mechanical vacuum feedthrough (in an embodiment in which the drive train 60 does not include an in situ motor). Such a mechanical vacuum feedthrough may, for example, be a magnetic coupling or a bellows coupling.

Figure 7:
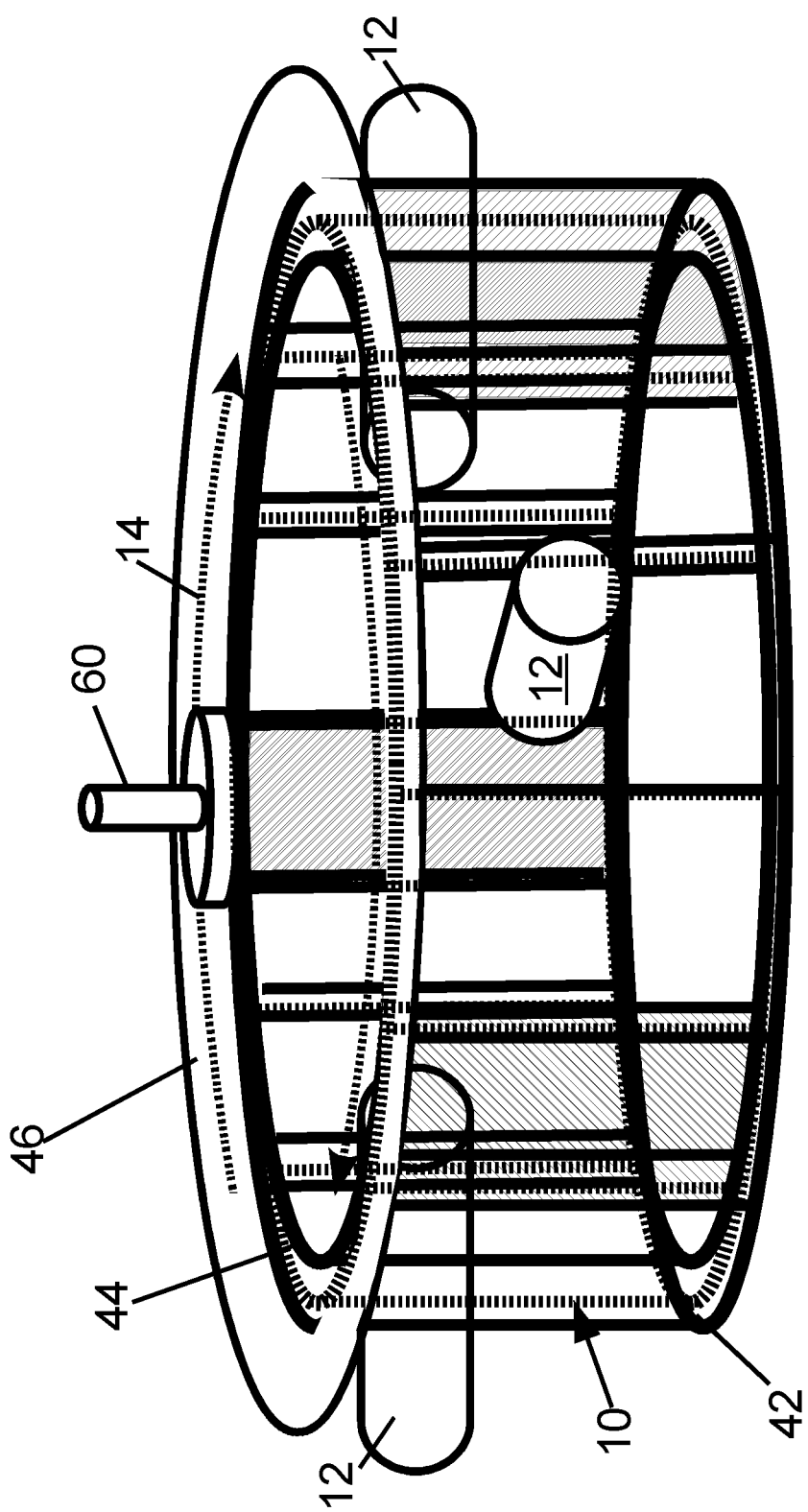
FIG. 7 diagrammatically illustrates a perspective view of the parts carousel of FIG. 4 and the sources shutter of FIG. 5 along with the shutter drive mechanism in accordance with the second deposition system embodiment, during deposition employing the deposition sources and with the sources shutter positioned for the deposition.

With reference to FIG. 7, the position of the shutter assembly 40 is shown after rotating the shutter assembly 40 via the drive train 60 to unblock the respective deposition source 12. This is the deposition arrangement—with the carousel 10 rotating as indicated by arrows 14, the various sources 12 can be operated in a desired sequence to deposit a desired stack of coating layers, as already described with reference to FIG. 1. Preferably, the drive train 60 has indexing or control to identify/set the shuttered position (FIG. 6) or the unshuttered position (FIG. 7) of the shutter assembly 40.

Figure 8:
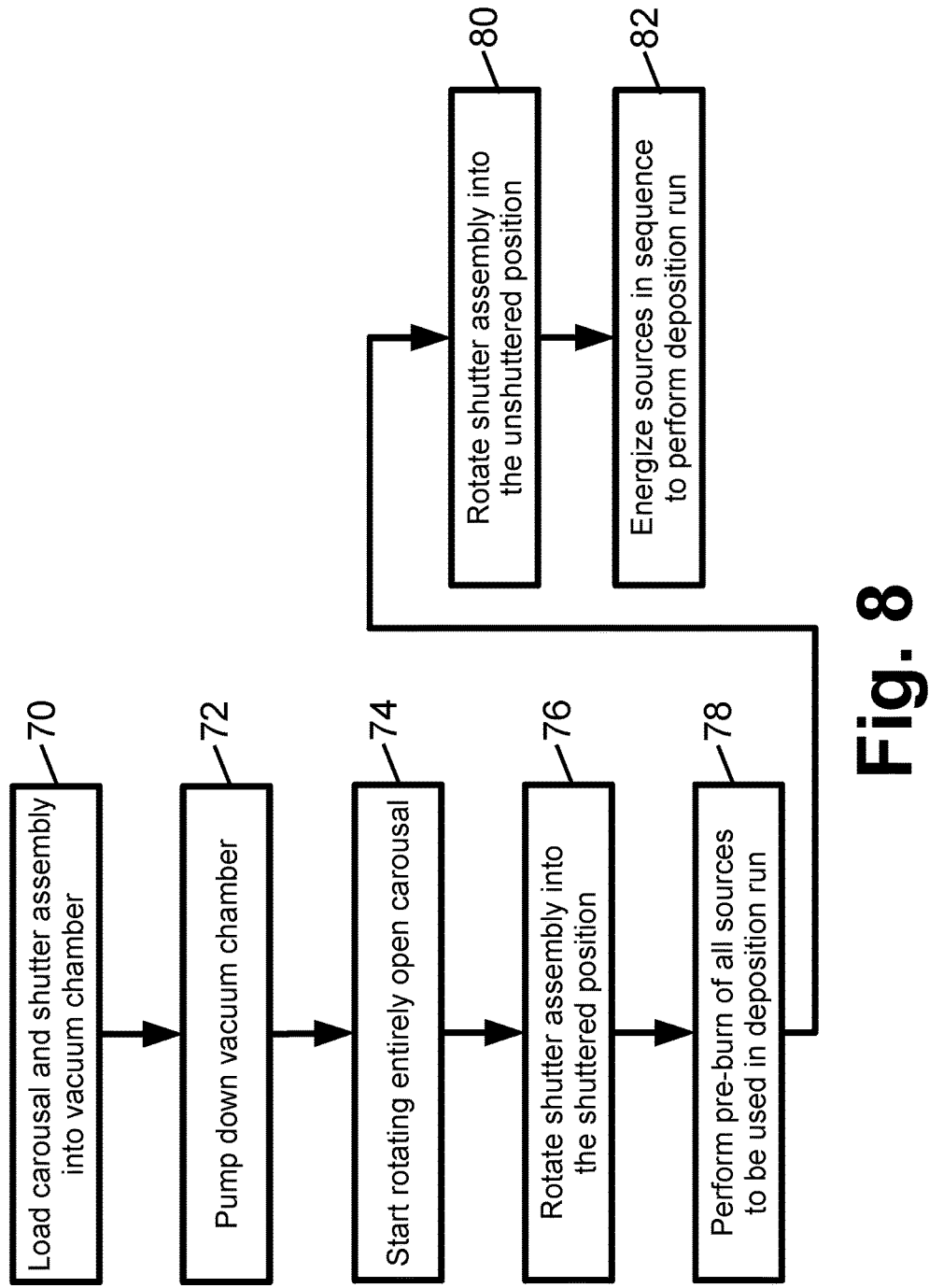
FIG. 8 diagrammatically illustrates a deposition method suitably performed using the second deposition system embodiment.

With continuing reference to FIGS. 4-7, and with further reference to FIG. 8, a sputter deposition run performed by the second deposition system embodiment of FIGS. 4-7 is described. In an operation 70, the carousel 10 containing parts to be coated is loaded into the vacuum chamber along with the shutter assembly 40. If the deposition system of the second embodiment has a relatively large number of deposition sources 12 (e.g. three, four, five, et cetera) and different deposition runs may use different deposition sources, then the shutter elements 52, 54 are preferably designed to be installed in different receptacles (e.g., different slots) of the shutter assembly 40, and for a particular upcoming sputter deposition run the shutter elements 52, 54 are loaded into the receptacles of the shutter assembly 40 that align with the deposition sources to be used in the upcoming run. In an operation 72 the vacuum chamber is pumped down. In an operation 74, the carousel 10 is rotated up to speed. (This could be done later so long as the carousel is up to rotational speed before the actual deposition begins). In an operation 76, the drive train 60 is operated to rotate the shutter assembly 40 into its shuttered position shown in FIG. 6. (Note that rotation of the shutter assembly 40 is independent of rotation of the carousel 10). In an operation 78, pre-burn is performed on all deposition sources 12 that are to be used in the sputter deposition run. The carousel 10 is rotating during the pre-burn operation 78 due to the preceding ramp-up operation 74, but again in an alternative embodiment the ramp-up is performed later (or even may be performed during the pre-burn operation 78). Due to the shutter assembly 40 being in the shuttered position of FIG. 6 during the pre-burn operation 78, the shutter elements 52, 54 are stationary at the respective deposition sources to receive the contaminants sputtered off the deposition sources during the pre-burn 78, thus protecting the parts loaded into the carousel 10. After the pre-burn 78 is complete, in an operation 80 the drive train 60 is operated to rotate the shutter assembly 40 into its unshuttered position shown in FIG. 7 so as to unblock the paths from the deposition sources 12 to the carousel 10. Thereafter, in an operation 82 the sputter deposition is performed by energizing sputter deposition sources 12 in the desired sequence (for a multi-layer deposition) to deposit the desired layers. It will be noted that during the deposition the shutter elements 52, 54 remain stationary in their positions shown in FIG. 7, and hence no deposition material is wasted by being coated onto the shutter elements 52, 54.

Thus, it is seen that the disadvantages of the first deposition system embodiment of FIGS. 1-3 are overcome by the second deposition system embodiment of FIGS. 4-8. The disadvantage of wasted space on the carousel 10 occupied by the blanking plates 24 is overcome by replacing these blanking plates by the shutter elements 52, 54 located on the separate (and separately rotatable) shutter assembly 40. The disadvantage of deposition material being wasted by coating the blanking plates 24 is overcome because in the deposition configuration of FIG. 7 the shutter elements 52, 54 that replace these blanking plates 24 are located in fixed positions outside of the flux paths from the deposition sources 12.

Figure 9:
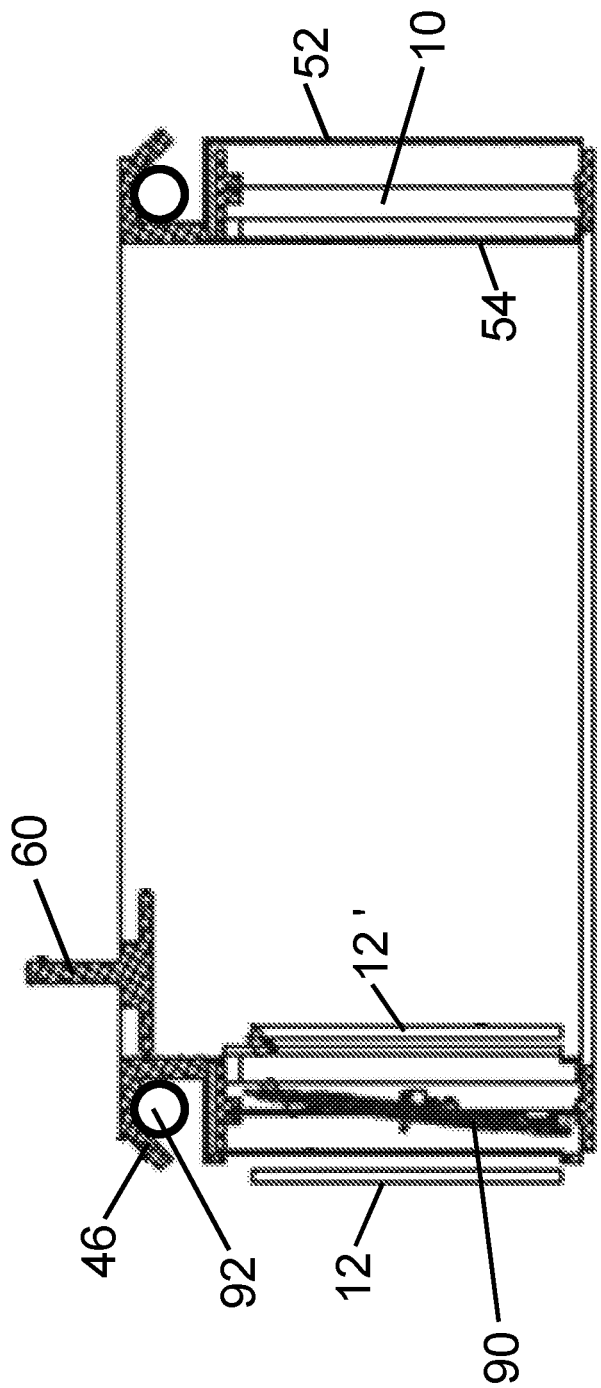
FIG. 9 diagrammatically illustrates a side sectional view of the parts carousel of FIG. 4 and the shutter assembly of FIG. 5 in accordance with the second deposition system embodiment.

With reference to FIG. 9, a side sectional view is shown of the operational assembly of the parts carousel 10 and shutter assembly 40 of the second deposition system embodiment. In this embodiment the outer deposition source 12 is shown in more realistic detail for a sputter deposition embodiment as a planar sputter source 12, and the corresponding inner planar sputter source 12' is also shown. An illustrative part 90 to be coated is also shown. The side sectional view of FIG. 9 better illustrates placement of the carousel 10 between the outer shutter element 52 and the inner shutter element 54. In FIG. 9, the connecting ring 46 is also shown having a lip that can engage a bearing 92 (e.g. a bearing ring or a ring of ball bearings) that simultaneously provides low friction for rotation of the shutter assembly 40 and also suspension support of the shutter assembly 40.

Figure 10:
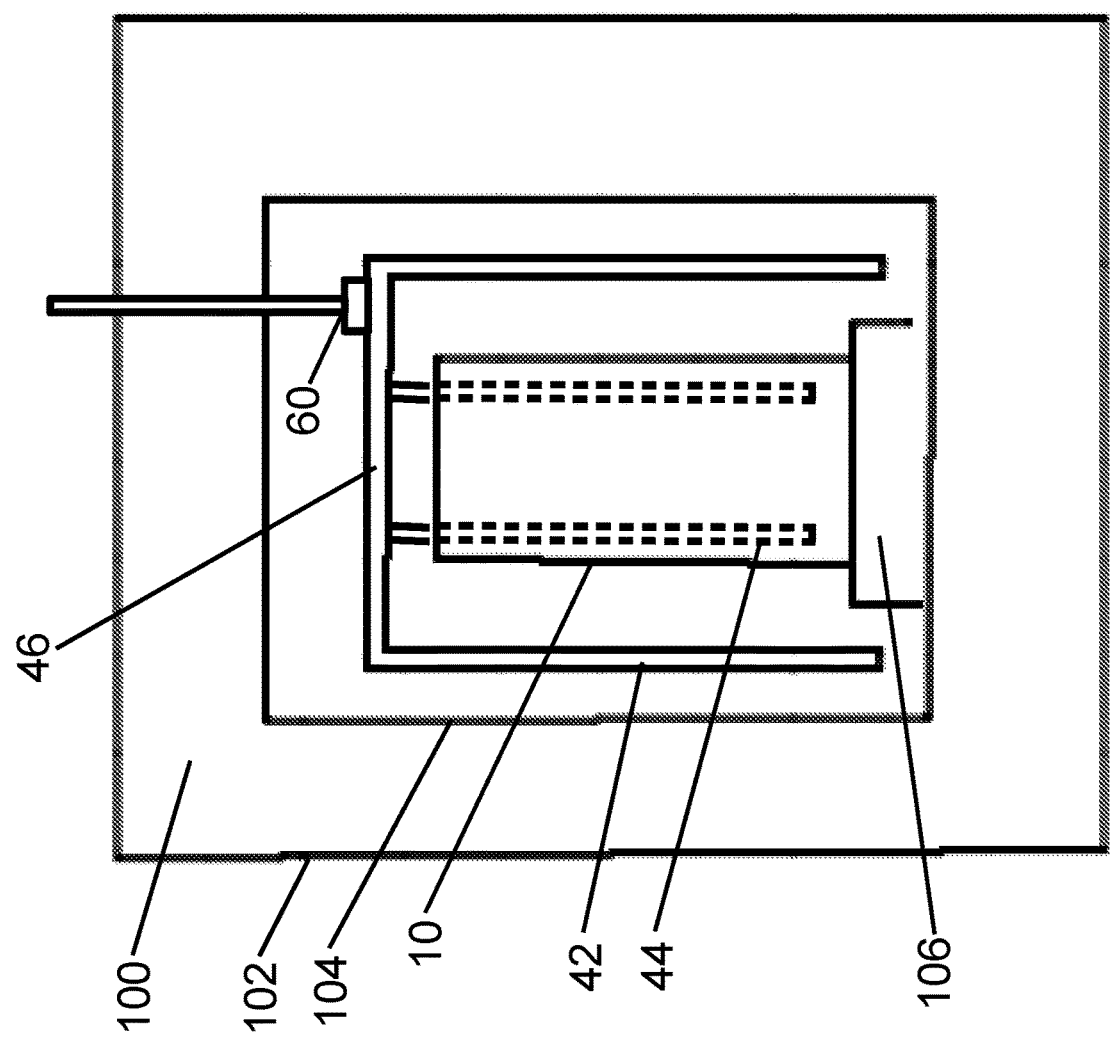
FIG. 10 diagrammatically illustrates a side sectional view of the second deposition system embodiment.

With reference to FIG. 10, a side sectional view of the second deposition system embodiment is shown, which diagrammatically shows the aforementioned (e.g. cylindrical) vacuum chamber 100 including outer chamber wall 102 and inner chamber wall 104, and a carousel drive ring or other carousel drive train 106 for rotating the carousel 10. The inner chamber wall 104 is preferably cylindrical and arranged concentrically with the cylindrical carousel 10 and cylindrical shutter sub-assemblies 42, 44. It is again emphasized that the carousel drive train 106 and the drive train 60 of the shutter assembly 40 are independent drive trains, so that the carousel 10 and the shutter assembly 40 can be rotated independently.

In the second deposition system embodiment of FIGS. 4-10, the shutter assembly 40 is constructed such that it covers both the inner and outer sides of a portion of carousel 10. The shutter assembly 40 is configured to rotate independently of the carousel 10, e.g. being driven from a chamber top-mounted drive motor via the drive train 60. This independent rotation of the separate shutter assembly 40 allows for the deposition sources 12, 12' that are active to be covered (i.e. shuttered) when removing an oxide layer (i.e. performing the pre-burn) or uncovered (i.e. unshuttered) when the coating is desired to be applied to the parts 90 loaded in the carousel 10 (i.e. the deposition phase). This arrangement advantageously allows a fully loaded carousel to be deployed (in other words, the entire 360° circumference of the parts carousel 10 can be loaded with parts) thereby increasing capacity by as much as 40% or more in some embodiments, and sputter target material utilization is improved by the same percentage.

In some suitable implementations, the shutter assembly 40 can either lift with a top plate of the vacuum chamber 100 via a hoist during opening of the vacuum chamber 100, or in another illustrative embodiment the shutter assembly 40 can be removed manually to allow access to the carousel beneath it during coating run changeovers. In some embodiments, the shutter elements 52, 54 are contemplated to be made of non-magnetic metals and positioned mid-way between the sputter source surface and the part to be coated on both the inner and outer coating regions. To avoid contamination, it is generally preferable that the shutter elements 52, 54 not contact either of the sputter sources 12, 12' or the part 90 to be coated before, during or after the coating deposition run. In another illustrative embodiment, the connecting ring or yoke 46 may be located below the carousel 10 so that the carousel 10 can be loaded/unloaded after removing the top plate of the vacuum chamber 100 without removing the shutter assembly 40.

The shutter drive mechanism 60 may, in some illustrative implementations, comprise an encoded motor or sensor system to allow positional recognition of where the shutter elements 52, 54 are positioned relative to various deposition sources 12, 12' in the vacuum chamber 100. The drive train 60 may be positioned manually in some embodiments, preferably with detent positioning to ensure it is in the shuttered position (FIG. 6) or unshuttered position (FIG. 7). In some automated embodiments, rotational drive energy created by an external motor is brought into the vacuum area of the chamber 100 through the use of any of a variety of commonly available feed through mechanisms (e.g. magnetic, bellows-based) and enters, e.g. through the top or sidewall of the vacuum chamber 100. The energy is translated by the drive mechanism 60 to the shutter assembly 40, e.g. via a drive ring mounted on the top of the chamber through gears (details of this illustrative example not shown).

It will be appreciated that various of the above-disclosed and other features and functions, or alternatives thereof, may be desirably combined into many other different systems or applications. It will be further appreciated that various presently unforeseen or unanticipated alternatives, modifications, variations or improvements therein may be subsequently made by those skilled in the art which are also intended to be encompassed by the following claims.

The invention claimed is:

1. A deposition system comprising:
a vacuum chamber;
a cylindrical parts carousel sized to load inside the vacuum chamber and having a carousel drive train operatively connected to rotate the cylindrical parts carousel about a cylinder axis;
two or more deposition sources arranged to flow deposition material onto the cylindrical parts carousel when the cylindrical parts carousel is loaded inside the vacuum chamber;
a shutter assembly including at least one cylindrical shutter sub-assembly having shutter elements corresponding to the deposition sources, the shutter assembly disposed or sized to load inside the vacuum chamber with the at least one cylindrical shutter sub-assembly arranged concentrically with the cylindrical parts carousel; and
a drive train configured to rotate the shutter assembly about the cylinder axis independently of rotation of the cylindrical parts carousel about the cylinder axis, the drive train configured to rotate the at least one cylindrical shutter sub-assembly between (1) a shuttered position in which each shutter element is interposed between its corresponding deposition source and the parts carousel and (2) an unshuttered position in which none of the shutter elements is interposed between its corresponding deposition source and the parts carousel.

2. The deposition system of claim 1 wherein each deposition source comprises a sputter deposition source including at least one sputter source arranged for deposition material sputtered from the sputter source to flow onto the cylindrical parts carousel when the cylindrical parts carousel is loaded inside the vacuum chamber.

3. The deposition system of claim 2 wherein:
each sputter deposition source includes:
an outer sputter source arranged at a larger radius than the cylindrical parts carousel such that deposition material sputtered from the outer sputter source flows inward onto the cylindrical parts carousel, and
an inner sputter source arranged at a smaller radius than the cylindrical parts carousel such that deposition material sputtered from the inner sputter source flows outward onto the cylindrical parts carousel; and
the at least one cylindrical shutter sub-assembly having shutter elements includes:
an outer cylindrical shutter sub-assembly arranged at a larger radius than the cylindrical parts carousel such that in the shuttered position each shutter element of the outer cylindrical shutter sub-assembly is interposed between its corresponding outer sputter source and the cylindrical parts carousel, and
an inner cylindrical shutter sub-assembly arranged at a smaller radius than the cylindrical parts carousel such that in the shuttered position each shutter element of the inner cylindrical shutter sub-assembly is interposed between its corresponding inner sputter source and the cylindrical parts carousel.

4. The deposition system of claim 3 wherein the shutter assembly further includes a connecting ring that connects the outer and inner cylindrical shutter sub-assemblies.

5. The deposition system of claim 1 wherein the vacuum chamber has a cylindrical inner wall and the cylindrical parts carousel is sized to load inside the vacuum chamber with the cylindrical parts carousel and the cylindrical inner wall of the vacuum chamber arranged concentrically.

6. The deposition system of claim 1 wherein the drive train is a manual drive train comprising a rotational mechanical vacuum feedthrough via which the at least one cylindrical shutter sub-assembly can be manually rotated with the vacuum chamber evacuated.

7. The deposition system of claim 1 wherein the shutter elements are installed in selected receptacles of the at least one cylindrical shutter sub-assembly.

8. A shuttering system for shuttering sputter deposition sources of a sputter deposition system during pre-burn of the sputter deposition sources, the sputter deposition system having a cylindrical parts carousel that rotates during sputter deposition, the shuttering system comprising:
at least one cylindrical shutter sub-assembly sized to be arranged concentrically inside or outside of the cylindrical parts carousel and having shutter elements arranged to (1) block the sputter deposition sources when the cylindrical shutter sub-assembly is in a shuttered rotational position and (2) not block the sputter deposition sources when the cylindrical shutter sub-assembly is in an unshuttered rotational position; and
a drive train configured to rotate the at least one cylindrical shutter sub-assembly between the shuttered and unshuttered rotational positions;
wherein the drive train is configured to rotate the at least one cylindrical shutter sub-assembly independently from the rotation of the cylindrical parts carousel and the drive train comprises a rotational mechanical vacuum feedthrough via which the at least one cylindrical shutter sub assembly can be manually rotated with the sputter deposition system under vacuum.

9. The shuttering system of claim 8 wherein the at least one cylindrical shutter sub-assembly includes:
an outer cylindrical shutter sub-assembly sized to be arranged concentrically outside of the cylindrical parts carousel;
an inner cylindrical shutter sub-assembly sized to be arranged concentrically inside of the cylindrical parts carousel; and
a connecting yoke that yokes together the outer and inner cylindrical shutter sub-assemblies to rotate together as a unit;
wherein the outer cylindrical shutter sub-assembly has shutter elements arranged to block outer sputter deposition sources when the yoked cylindrical shutter sub-assemblies are in the shuttered rotational position and to not block the outer sputter deposition sources when the yoked cylindrical shutter sub-assemblies are in the unshuttered rotational position; and
wherein the inner cylindrical shutter sub-assembly has shutter elements arranged to block inner sputter deposition sources when the yoked cylindrical shutter sub-assemblies are in the shuttered rotational position and to not block the inner sputter deposition sources when the yoked cylindrical shutter sub-assemblies are in the unshuttered rotational position.

10. The shuttering system of claim 8 wherein the drive train comprises a motor configured to rotate the at least one cylindrical shutter sub-assembly with the sputter deposition system under vacuum.

11. The shuttering system of claim 8 wherein the shutter elements are installed in selected receptacles of the at least one cylindrical shutter sub-assembly.

12. A deposition system comprising:
a vacuum chamber having a cylindrical inner wall;
a cylindrical parts carousel disposed concentrically inside the cylindrical inner wall of the vacuum chamber;
two or more deposition sources arranged to flow deposition material onto the cylindrical parts carousel;
a cylindrical shutter assembly disposed concentrically inside the cylindrical inner wall of the vacuum chamber and having (1) a shuttered position in which the cylindrical shutter assembly blocks all of the two or more deposition sources from depositing onto the parts carousel and (2) an unshuttered position in which the cylindrical shutter assembly does not block any of the two or more deposition sources from depositing onto the parts carousel; and
a drive train configured to rotate the cylindrical shutter assembly between the shuttered and unshuttered positions, the drive train not operatively connected to rotate the cylindrical parts carousel.

13. The deposition system of claim 12 wherein:
each deposition source includes:
an outer sputter deposition source arranged at a larger radius than the cylindrical parts carousel such that deposition material sputtered from the outer sputter deposition source flows inward onto the cylindrical parts carousel, and
an inner sputter deposition source arranged at a smaller radius than the cylindrical parts carousel such that deposition material sputtered from the inner sputter deposition source flows outward onto the cylindrical parts carousel; and
the at least one cylindrical shutter sub-assembly having shutter elements includes:
an outer cylindrical shutter sub-assembly arranged at a larger radius than the cylindrical parts carousel such that in the shuttered position the outer cylindrical shutter assembly blocks all of the outer sputter deposition sources from depositing onto the parts carousel and in the unshuttered position the outer cylindrical shutter assembly does not block any of the outer sputter deposition sources from depositing onto the parts carousel, and
an inner cylindrical shutter sub-assembly arranged at a smaller radius than the cylindrical parts carousel such that in the shuttered position the inner cylindrical shutter assembly blocks all of the inner sputter deposition sources from depositing onto the parts carousel and in the unshuttered position the inner cylindrical shutter assembly does not block any of the inner sputter deposition sources from depositing onto the parts carousel.

14. The deposition system of claim 13 wherein the shutter assembly further includes a connecting ring that connects the outer and inner cylindrical shutter sub-assemblies.

15. The deposition system of claim 12 wherein the drive train is a manual drive train comprising a rotational mechanical vacuum feedthrough via which the at least one cylindrical shutter sub-assembly can be manually rotated with the vacuum chamber evacuated.

16. The deposition system of claim 12 wherein the two or more deposition sources arranged to flow deposition material onto the cylindrical parts carousel include at least three deposition sources arranged to flow deposition material onto the cylindrical parts carousel.

17. The deposition system of claim 1 wherein the two or more deposition sources arranged to flow deposition material onto the cylindrical parts carousel include at least three deposition sources arranged to flow deposition material onto the cylindrical parts carousel.

18. The shuttering system of claim 8 wherein said sputter deposition sources include at least two sputter deposition sources and the at least one cylindrical shutter sub-assembly has shutter elements arranged to (1) block all sputter deposition sources when the cylindrical shutter sub-assembly is in a shuttered rotational position and (2) not block any sputter deposition sources when the cylindrical shutter sub-assembly is in an unshuttered rotational position.

19. The shuttering system of claim 18 wherein said at least two sputter deposition sources include at least three sputter deposition sources.

* * * * *